(12) United States Patent
Dysard et al.

(10) Patent No.: US 7,994,057 B2
(45) Date of Patent: Aug. 9, 2011

(54) POLISHING COMPOSITION AND METHOD UTILIZING ABRASIVE PARTICLES TREATED WITH AN AMINOSILANE

(75) Inventors: Jeffrey Dysard, St. Charles, IL (US); Sriram Anjur, Aurora, IL (US); Steven Grumbine, Aurora, IL (US); Daniela White, Oswego, IL (US); William Ward, Glen Ellyn, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 384 days.

(21) Appl. No.: 12/234,173

(22) Filed: Sep. 19, 2008

(65) Prior Publication Data

US 2009/0081871 A1 Mar. 26, 2009

Related U.S. Application Data

(60) Provisional application No. 60/974,340, filed on Sep. 21, 2007.

(51) Int. Cl.
*H01L 21/302* (2006.01)
*H01L 21/461* (2006.01)

(52) U.S. Cl. ........ 438/690; 438/691; 438/692; 438/693; 51/307; 51/308

(58) Field of Classification Search .................. None
See application file for complete search history.

(56) References Cited

U.S. PATENT DOCUMENTS

| | | |
|---|---|---|
| 5,174,813 A | 12/1992 | Cifuentes et al. |
| 5,196,353 A | 3/1993 | Sandhu et al. |
| 5,230,833 A | 7/1993 | Romberger et al. |
| 5,385,975 A | 1/1995 | Nakamura et al. |
| 5,428,107 A | 6/1995 | Tysak et al. |
| 5,433,651 A | 7/1995 | Lustig et al. |
| 5,489,233 A | 2/1996 | Cook et al. |
| 5,527,423 A | 6/1996 | Neville et al. |
| 5,609,511 A | 3/1997 | Moriyama et al. |
| 5,643,046 A | 7/1997 | Katakabe et al. |
| 5,645,736 A | 7/1997 | Allman |
| 5,658,183 A | 8/1997 | Sandhu et al. |
| 5,730,642 A | 3/1998 | Sandhu et al. |
| 5,767,016 A | 6/1998 | Muroyama |
| 5,770,103 A | 6/1998 | Wang et al. |
| 5,838,447 A | 11/1998 | Hiyama et al. |
| 5,872,633 A | 2/1999 | Holzapfel et al. |
| 5,893,796 A | 4/1999 | Birang et al. |
| 5,949,927 A | 9/1999 | Tang |
| 5,964,643 A | 10/1999 | Birang et al. |
| 6,062,968 A | 5/2000 | Sevilla et al. |
| 6,117,000 A | 9/2000 | Anjur et al. |
| 6,126,532 A | 10/2000 | Sevilla et al. |
| 6,136,711 A | 10/2000 | Grumbine et al. |
| 6,372,648 B1 | 4/2002 | Hall et al. |
| 6,390,890 B1 | 5/2002 | Molnar |
| 6,582,623 B1 | 6/2003 | Grumbine et al. |
| 6,646,348 B1 | 11/2003 | Grumbine et al. |
| 6,656,241 B1 * | 12/2003 | Hellring et al. ............... 51/308 |
| 6,730,245 B2 | 5/2004 | Hampden-Smith et al. |
| 6,776,810 B1 * | 8/2004 | Cherian et al. ............... 51/307 |
| 6,786,945 B2 | 9/2004 | Machii et al. |
| 7,038,633 B2 | 5/2006 | Eriksson |
| 7,044,836 B2 | 5/2006 | Sun et al. |
| 7,217,989 B2 | 5/2007 | Hiramitsu et al. |
| 2005/0012658 A1 | 1/2005 | Eriksson |
| 2006/0084270 A1 | 4/2006 | Hiramitsu et al. |

FOREIGN PATENT DOCUMENTS

| | | |
|---|---|---|
| JP | 2002294220 A | 10/2002 |
| JP | 2006147993 A | 6/2006 |
| TW | 539741 B | 7/2003 |
| WO | WO 2005/075579 A1 | 8/2005 |

* cited by examiner

*Primary Examiner* — Duy-Vu N Deo
(74) *Attorney, Agent, or Firm* — Thomas E. Omholt; Nancy J. Gettel; Steven D. Weseman

(57) ABSTRACT

The inventive method comprises chemically-mechanically polishing a substrate with an inventive polishing composition comprising a liquid carrier, a cationic polymer, an acid, and abrasive particles that have been treated with an aminosilane compound.

19 Claims, No Drawings

POLISHING COMPOSITION AND METHOD UTILIZING ABRASIVE PARTICLES TREATED WITH AN AMINOSILANE

CROSS-REFERENCE TO RELATED APPLICATIONS

This patent application claims the benefit of U.S. Provisional Patent Application No. 60/974,340, filed Sep. 21, 2007, which is incorporated by reference.

BACKGROUND OF THE INVENTION

Chemical-mechanical polishing (CMP) compositions and methods for polishing (e.g., planarizing) the surface of a substrate are well known in the art. Polishing compositions (also known as polishing slurries, CMP slurries, and CMP compositions) typically contain an abrasive material in an aqueous solution and are applied to a surface by contacting the surface with a polishing pad saturated with the polishing composition. Typical abrasive materials include metal oxide particles, such as silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing composition comprising high purity fine metal oxide particles in an aqueous medium. The polishing composition is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern.

A semiconductor wafer typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs) comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon.

Chemical-mechanical polishing is used to planarize the surface of the metal layers or thin-films during the various stages of device fabrication. Many of the known CMP compositions are suitable for limited purposes. However, many conventional CMP compositions tend to exhibit unacceptable polishing rates and selectivity levels with respect to insulator materials used in wafer manufacture. In addition, many CMP compositions tend to exhibit poor film removal traits for the underlying films or produce deleterious film-corrosion, which leads to poor manufacturing yields.

As the technology for integrated circuit devices advances, traditional materials are being used in new and different ways to achieve the level of performance needed for advanced integrated circuits. In particular, silicon nitride and silicon oxide are being used in various combinations to achieve new and ever more complex device configurations. In general, the structural complexity and performance characteristics vary across different applications. There is an ongoing need for methods and compositions that allow for the removal rates of various layers (e.g., silicon nitride, silicon oxide) to be adjusted or tuned during CMP to meet the polishing requirements for particular devices. The present invention provides such improved polishing methods and compositions. These and other advantages of the invention, as well as additional inventive features, will be apparent from the description of the invention provided herein.

BRIEF SUMMARY OF THE INVENTION

The invention provides a chemical-mechanical polishing composition for polishing a substrate comprising (a) a liquid carrier, (b) an abrasive suspended in the liquid carrier, wherein the abrasive comprises colloidal silica particles, (c) at least one acidic component having a pKa of about 1 to about 4, and (d) a cationic polymer; wherein the polishing composition has a pH of about 1 to about 3.5.

The invention also provides a method of chemically-mechanically polishing a substrate, which method comprises (i) contacting a substrate, especially a substrate comprising at least one layer of silicon nitride, with a chemical-mechanical polishing composition comprising: (a) a liquid carrier, (b) an abrasive suspended in the liquid carrier, wherein the abrasive comprises colloidal silica particles, (c) at least one acidic component having a pKa of about 1 to about 4, and (d) a cationic polymer, (ii) moving the polishing composition relative to the substrate, and (iii) abrading at least a portion of the substrate to polish the substrate.

DETAILED DESCRIPTION OF THE INVENTION

The invention provides a chemical-mechanical polishing composition as well as a method of chemically-mechanically polishing a substrate. The polishing composition comprises (a) a liquid carrier, (b) an abrasive suspended in the liquid carrier, wherein the abrasive comprises colloidal silica particles, (c) at least one acidic component having a pKa of about 1 to about 4, and (d) a cationic polymer; wherein the polishing composition has a pH of about 1 to about 3.5. The method comprises (i) contacting a substrate with the chemical-mechanical polishing composition, which can have any suitable pH, (ii) moving the polishing composition relative to the substrate, and (iii) abrading at least a portion of the substrate to polish the substrate.

The polishing method can further comprise contacting the substrate with a polishing pad (e.g., polishing surface), which is moved relative to the substrate with the polishing composition therebetween. The polishing pad can be any suitable polishing pad, many of which are known in the art. Suitable polishing pads include, for example, woven and non-woven polishing pads. Moreover, suitable polishing pads can comprise any suitable polymer or combination of polymers of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The polishing pad can comprise fixed abrasive particles on or within the polishing surface of the polishing pad, or the polishing pad can be free or substantially free of fixed abrasive particles. Fixed abrasive polishing pads include pads having abrasive particles affixed to the polishing surface of the polishing pad by way of an adhesive, binder, ceramer, resin, or the like or abrasives that have been impregnated within a polishing pad so as to form an integral part of the polishing pad, such as, for example, a fibrous batt impregnated with an abrasive-containing polyurethane dispersion.

The polishing pad can have any suitable configuration. For example, the polishing pad can be circular and, when in use, typically will have a rotational motion about an axis perpendicular to the plane defined by the surface of the pad. The polishing pad can be cylindrical, the surface of which acts as the polishing surface, and, when in use, typically will have a rotational motion about the central axis of the cylinder. The polishing pad can be in the form of an endless belt, which, when in use, typically will have a linear motion with respect to the cutting edge being polished. The polishing pad can have any suitable shape and, when in use, have a reciprocating or orbital motion along a plane or a semicircle. Many other variations will be readily apparent to the skilled artisan.

The polishing composition contains an abrasive which comprises colloidal silica particles and is desirably is suspended in the liquid carrier (e.g., water). Colloidal silica particles are prepared via a wet process and typically are non-aggregated, individually discrete particles, which generally are spherical or nearly spherical in shape, but can have other shapes (e.g., shapes with generally elliptical, square, or rectangular cross-sections). Such particles typically are structurally different from fumed particles, which are prepared via a pyrogenic or flame hydrolysis process and are chain-like structures of aggregated primary particles.

Preferably, the colloidal silica is precipitated or condensation-polymerized silica, which can be prepared using any method known to those of ordinary skill in the art, such as by the sol gel method or by silicate ion-exchange. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as the BINDZIL 50/80, 30/310, and 40/130 products from EKA Chemicals, the Fuso PL-1, PL-2, PL-3, and PL-3H products, and the Nalco 1034A, 1050, 2327, and 2329 products, as well as other similar products available from DuPont, Bayer, Applied Research, Nissan Chemical (the SNOWTEX products), and Clariant.

The particle size of a particle is the diameter of the smallest sphere that encompasses the particle. The abrasive particles can have any suitable particle size. The abrasive particles have an average particle size of about 5 nm or more (e.g., about 10 nm or more, about 15 nm or more, about 20 nm or more, or about 30 nm or more). The abrasive particles can have an average particle size of about 150 nm or less (e.g., about 130 nm or less, about 80 nm or less, about 50 nm or less, or about 30 nm or less). Accordingly, the abrasive particles can have an average particle size of about 10 nm to about 150 nm (e.g., about 20 nm to about 130 nm, about 15 nm to about 100 nm, about 20 nm to about 80 nm, or about 20 nm to about 60 nm).

Any suitable amount of colloidal silica particles can be present in the polishing composition. Typically, about 0.01 wt. % or more (e.g., about 0.05 wt. % or more) colloidal silica will be present in the polishing composition. More typically, about 0.1 wt. % or more (e.g., about 1 wt. % or more, about 5 wt. % or more, about 7 wt. % or more, about 10 wt. % or more, or about 12 wt. % or more) colloidal silica particles will be present in the polishing composition. The amount of colloidal silica particles in the polishing composition typically will be about 30 wt. % or less, more typically will be about 20 wt. % or less (e.g., about 15 wt. % or less, about 10 wt. % or less, about 5 wt. % or less, about 3 wt. % or less, or about 2 wt. % or less). Preferably, the amount of colloidal silica particles in the polishing composition is about 0.01 wt. % to about 20 wt. %, and more preferably about 0.05 wt. % to about 15 wt. % (e.g., about 0.1 wt. % to about 10 wt. %, about 0.1 wt. % to about 4 wt. %, about 0.1 wt. % to about 3 wt. %, about 0.1 wt. % to about 2 wt. %, or about 0.2 wt. % to about 2 wt. %).

The colloidal silica particles are preferably treated with at least one aminosilane compound. Such compounds include primary aminosilanes, secondary aminosilanes, tertiary aminosilanes, quaternary aminosilanes, and multi-podal (e.g., dipodal) silanes. The aminosilane compound can be any suitable aminosilane, such as aminopropyl trialkoxysilane, gamma-aminopropyl triethoxysilane (e.g., SILQUEST A1100), bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, and bis(trimethoxysilylpropyl)amine (e.g., SILQUEST A 1170).

Any suitable method of treating the colloidal silica particles, many of which are known to those of ordinary skill in the art can be used. For example, the colloidal silica particles can be treated with the aminosilane compound before mixing with the other components of the polishing composition or the aminosilane and the colloidal silica particles can be added simultaneously to the other components of the polishing composition.

The aminosilane compound can be present in the polishing composition in any suitable amount. Typically, the polishing composition comprises about 10 ppm or more (e.g., about 20 ppm or more, about 30 ppm or more, about 50 ppm or more, about 70 ppm or more, about 100 ppm or more, or about 150 ppm or more) aminosilane compound. The polishing composition preferably comprises about 2000 ppm or less (e.g., about 1000 ppm or less, about 800 ppm or less, about 600 ppm or less, about 500 ppm or less, about 400 ppm or less, or about 300 ppm or less) aminosilane compound. Preferably, the polishing composition comprises about 10 ppm to about 2000 ppm (e.g., about 20 ppm to about 1000 ppm, about 30 ppm to about 800 ppm, about 50 ppm to about 500 ppm, or about 150 ppm to about 400 ppm) aminosilane compound.

The zeta potential of a particle refers to the difference between the electrical charge of the ions surrounding the particle and the electrical charge of the bulk solution (e.g., the liquid carrier and any other components dissolved therein). Generally, before the colloidal silica particles are treated with the aminosilane compound, the colloidal silica particles have a zeta potential of zero. After treatment with the aminosilane compound, the treated colloidal silica particles have a positive charge, and thus a positive zeta potential. Typically, the treated colloidal silica particles have a zeta potential of about 5 mV or more (e.g., about 10 mV or more, about 15 mV or more, about 20 mV or more, about 25 mV or more, or about 30 mV or more). The treated colloidal silica particles preferably have a zeta potential of about 50 mV or less (e.g., about 45 mV or less, about 40 mV or less, or about 35 mV or less). Preferably, the treated colloidal silica particles have a zeta potential of about 5 mV to about 50 mV (e.g., about 10 mV to about 45 mV, about 15 mV to about 40 mV, or about 20 mV to about 40 mV).

A liquid carrier is used to facilitate the application of the abrasive and any optional additives to the surface of a suitable substrate to be polished (e.g., planarized). The liquid carrier can be any suitable carrier (e.g., solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition also contains at least one acidic component having a pKa of about 1 to about 4. The at least one acid component comprises, consists of, or consists essentially of materials having at least one acidic hydrogen that has a dissociation constant corresponding to a pKa in the range of about 1 to 4. Accordingly, materials having a single acidic hydrogen, as well as materials having two or more acidic hydrogens, can be the acid component of the composition. Materials that have two or more acidic hydrogens (e.g., sulfuric acid, phosphoric acid, succinic acid, citric acid, and the like) have a plurality of successive pKa values corresponding to the successive dissociation of each acidic hydrogen. For example, phosphoric acid has three acidic hydrogens, and three pKa values (i.e., 2.1, 7.2, and 12.4) corresponding to dissociation of the first, second, and third hydrogens, respectively. For materials having multiple acidic hydrogens, only one of the pKa values must be in the range of 1 to 4. Any other acidic hydrogen in such compounds can have a pKa within the range of 1 to 4, can have a pKa less than 1, or can have a pKa greater than 4.

The acid can be any suitable acid having a pKa in the range of about 1 to about 4, such as an inorganic acid, a carboxylic acid, an organic phosphonic acid, or an acidic heterocyclic compound. For example, the acid can be aspartic acid, butane-1,2,3,4-tetracarboxyic acid, chloroacetic acid, o-chlorobenzoic acid, citric acid, formic acid, glutamic acid, glycine, glycolic acid, hippuric acid, itaconic acid, lactic acid, malonic acid, mandelic acid, 1-naphthoic acid, phthalic acid, isophthalic acid, terephthalic acid, quinolinic acid, salicylic acid, sulfanilic acid, alpha-tartaric acid, meso-tartaric acid, o-toluic acid, uric acid, nitrous acid, sulfuric acid, sulfurous acid, tetraboric acid, or a phosphorus-containing acid, such as phosphoric acid, phosphorous acid, 1-hydroxyethylidene-1, 1-diphosphonic acid (e.g., DEQUEST 2010), amino tri(methylene phosphonic acid) (e.g., DEQUEST 2000), or combinations thereof.

The acid can be present in the polishing composition in any suitable amount. Typically, the polishing composition comprises about 50 ppm or more (e.g., about 80 ppm or more, about 100 ppm or more, about 200 ppm or more, about 300 ppm or more, about 400 ppm or more, about 500 ppm or more, or about 600 ppm or more) acid. The polishing composition preferably comprises about 5000 ppm or less (e.g., about 4000 ppm or less, about 3000 ppm or less, or about 2000 ppm or less) acid. Preferably, the polishing composition comprises about 50 ppm to about 5000 ppm (e.g., about 80 ppm to about 3000 ppm, about 100 ppm to about 3000 ppm, about 500 ppm to about 3000 ppm, or about 800 ppm to about 2000 ppm) acid.

The polishing composition further comprises a cationic polymer. The cationic polymer can be any suitable cationic polymer. For example, the cationic polymer can be polyethyleneimine, ethoxylated polyethyleneimine, polydiallyldimethylammonium halide, poly(amidoamine), poly(methacryloyloxyethyldimethylammonium)chloride, poly(vinylpyrrolidone), poly(vinylimidazole), poly(vinylpyridine), poly(vinylamine), a monomer or homopolymer of methacryloyloxyethyltrimethylammonium (e.g., Alco 4773), diallyldimethylammonium (e.g., Nalco TX13645), their copolymers with anionic or neutral monomers such as acrylic or vinyl comonomers (alkylacrylates, alkylmethacrylates, acrylamide, styrene, etc.), and combinations thereof.

The cationic polymer can have any suitable molecular weight. Typically, the polishing composition comprises a cationic polymer having a molecular weight of about 5 kDa or more (e.g., about 10 kDa or more, about 20 kDa or more, about 30 kDa or more, about 40 kDa or more, about 50 kDa or more, or about 60 kDa or more) cationic polymer. The polishing composition preferably comprises a cationic polymer having a molecular weight of about 100 kDa or less (e.g., about 80 kDa or less, about 70 kDa or less, about 60 kDa or less, or about 50 kDa or less). Preferably, the polishing composition comprises a cationic polymer having a molecular weight of about 5 kDa to about 100 kDa (e.g., about 10 kDa to about 80 kDa, about 10 kDa to about 70 kDa, or about 15 kDa to about 70 kDa.

The cationic polymer can be present in the polishing composition in any suitable amount. Typically, the polishing composition comprises about 5 ppm or more (e.g., about 10 ppm or more, about 20 ppm or more, about 30 ppm or more, about 40 ppm or more, about 50 ppm or more, or about 60 ppm or more) cationic polymer. The polishing composition preferably comprises about 500 ppm or less (e.g., about 400 ppm or less, about 300 ppm or less, about 200 ppm or less, or about 100 ppm or less) cationic polymer. Preferably, the polishing composition comprises about 5 ppm to about 500 ppm (e.g., about 10 ppm to about 400 ppm, about 10 ppm to about 300 ppm, about 10 ppm to about 200 ppm, about 10 ppm to about 100 ppm, about 20 ppm to about 80 ppm, or about 30 ppm to about 70 ppm) cationic polymer.

Although not wishing to be bound by a particular theory, it is believed that, if the polymer interacts with the treated colloidal silica particles rather than remaining free in solution, the charge of the particles is neutralized, which reduces the stability of the colloid, causes the treated colloidal silica particles to agglomerate, and increases the overall size of the particles. Larger particles can decrease substrate removal rates and increase substrate defects. Thus, is it desirable to maintain as much as possible of the polymer that is in the polishing composition free in solution. Preferably, the polishing composition has about 5 ppm or more (e.g., about 10 ppm or more, about 15 ppm or more, about 20 ppm or more, about 30 ppm or more, or about 40 ppm or more) polymer free in solution.

It is also desirable for the silane treating agent to remain associated with the colloidal silica particles over time. Although not wishing to be bound by a particular theory, it is believed that a multi-podal aminosilane treating agent (e.g., SILQUEST Al 170), which contains multiple silyl groups, is less likely to become free in solution over time. Preferably, the polishing composition has about 200 ppm or less (e.g., about 150 ppm or less, about 120 ppm or less, about 100 ppm or less, about 80 ppm or less, or about 50 ppm or less) aminosilane treating agent free in solution.

The polishing composition optionally comprises an oxidizing agent, which can be any suitable oxidizing agent for one or more materials of the substrate to be polished with the polishing composition. Preferably, the oxidizing agent is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof. The oxidizing agent can be present in the polishing composition in any suitable amount. Typically, the polishing composition comprises about 0.01 wt. % or more (e.g., about 0.02 wt. % or more, about 0.1 wt. % or more, about 0.5 wt. % or more, or about 1 wt. % or more) oxidizing agent. The polishing composition preferably comprises about 20 wt. % or less (e.g., about 15 wt. % or less, about 10 wt. % or less, or about 5 wt. % or less) oxidizing agent. Preferably, the polishing composition comprises about 0.01 wt. % to about 20 wt. % (e.g., about 0.05 wt. % to about 15 wt. %, about 0.1 wt. % to about 10 wt. %, about 0.3 wt. % to about 6 wt. %, or about 0.5 wt. % to about 4 wt. %) oxidizing agent.

The polishing composition, specifically the liquid carrier with any components dissolved or suspended therein, can have any suitable pH. The polishing composition can have a pH of less than about 7 (e.g., about 6 or less, about 4 or less, about 3.5 or less, about 3 or less, or about 2.5 or less). The polishing composition can have a pH of about 1 or more (e.g., about 1.5 or more, about 2 or more, about 2.5 or more, about 3 or more, or about 3.5 or more). The pH can be, for example, from about 1 to about 7 (e.g., from about 1 to about 5, from about 1 to about 3.5, from about 1 to about 3, from about 1 to about 2.5, or from about 1.5 to about 3.5).

The pH of the polishing composition can be achieved and/or maintained by any suitable means. More specifically, the polishing composition can further comprise a pH adjustor, a pH buffering agent, or a combination thereof. The pH adjustor can comprise, consist essentially of, or consist of any suitable pH-adjusting compound. For example, the pH adjustor can be the acid of the polishing composition. The pH buffering agent can be any suitable buffering agent, for example, phosphates, acetates, borates, sulfonates, carboxylates, ammonium salts, and the like. The polishing composition can comprise any suitable amount of a pH adjustor and/or a pH buffering agent, provided such amount is sufficient to achieve and/or maintain the desired pH of the polishing composition, e.g., within the ranges set forth herein.

The polishing composition optionally comprises a corrosion inhibitor (i.e., a film-forming agent). The corrosion inhibitor can comprise, consist essentially of, or consist of any suitable corrosion inhibitor. Preferably, the corrosion inhibitor is glycine. The amount of corrosion inhibitor used in the polishing composition typically is about 0.0001 wt. % to about 3 wt. % (preferably about 0.001 wt. % to about 2 wt. %) based on the total weight of the polishing composition.

The polishing composition optionally comprises a chelating or complexing agent. The complexing agent is any suitable chemical additive that enhances the removal rate of the substrate layer being removed, or that removes trace metal contaminants in silicon polishing. Suitable chelating or complexing agents can include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, oxalic acid, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like), and amine-containing compounds (e.g., ammonia, amino acids, amino alcohols, di-, tri-, and polyamines, and the like). The choice of chelating or complexing agent will depend on the type of substrate layer being removed with the polishing composition.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The polishing composition optionally further comprises one or more other additives. Such additives include acrylates comprising one or more acrylic subunits (e.g., vinyl acrylates and styrene acrylates), and polymers, copolymers, and oligomers thereof, and salts thereof.

The polishing composition can comprise a surfactant and/or rheological control agent, including viscosity enhancing agents and coagulants (e.g., polymeric rheological control agents, such as, for example, urethane polymers). Suitable surfactants can include, for example, cationic surfactants, anionic surfactants, nonionic surfactants, amphoteric surfactants, mixtures thereof, and the like. Preferably, the polishing composition comprises a nonionic surfactant. One example of a suitable nonionic surfactant is an ethylenediamine polyoxyethylene surfactant. The amount of surfactant in the polishing composition typically is about 0.0001 wt. % to about 1 wt. % (preferably about 0.001 wt. % to about 0.1 wt. %, and more preferably about 0.005 wt. % to about 0.05 wt. %).

The polishing composition can comprise an antifoaming agent. The antifoaming agent can comprise, consist essentially of, or consist of any suitable anti-foaming agent. Suitable antifoaming agents include, but are not limited to, silicon-based and acetylenic diol-based antifoaming agents. The amount of anti-foaming agent in the polishing composition typically is about 10 ppm to about 140 ppm.

The polishing composition can comprise a biocide. The biocide can comprise, consist essentially of, or consist of any suitable biocide, for example an isothiazolinone biocide. The amount of biocide in the polishing composition typically is about 1 to about 50 ppm, preferably about 10 to about 20 ppm.

The polishing composition preferably is colloidally stable. The term colloid refers to the suspension of the particles in the liquid carrier. Colloidal stability refers to the maintenance of that suspension through time. A polishing composition is considered colloidally stable if, when the polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the polishing composition ([C] in terms of g/ml) is less than or equal to 0.5 (i.e., $\{[B]-[T]\}/[C] \leqq 0.5$). Preferably, the value of [B]−[T]/[C] is less than or equal to 0.3, more preferably is less than or equal to 0.1, even more preferably is less than or equal to 0.05, and most preferably is less than or equal to 0.01.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., liquid carrier, abrasive, acid, etc.) as well as any combination of ingredients (e.g., water, treated abrasives, surfactants, etc.).

The polishing composition can be supplied as a one-package system comprising a liquid carrier, and optionally an abrasive and/or other additives. Alternatively, some of the components, such as an oxidizing agent, can be supplied in a first container, either in dry form, or as a solution or dispersion in the liquid carrier, and the remaining components, such as the abrasive and other additives, can be supplied in a second container or multiple other containers. Other two-container, or three or more container, combinations of the components of the polishing composition are within the knowledge of one of ordinary skill in the art.

Solid components, such as an abrasive, can be placed in one or more containers either in dry form or as a solution in the liquid carrier. Moreover, it is suitable for the components in the first, second, or other containers to have different pH values, or alternatively to have substantially similar, or even equal, pH values. The components of the polishing composition can be partially or entirely supplied separately from each other and can be combined, e.g., by the end-user, shortly before use (e.g., 1 week or less prior to use, 1 day or less prior to use, 1 hour or less prior to use, 10 minutes or less prior to use, or 1 minute or less prior to use).

The polishing composition also can be provided as a concentrate which is intended to be diluted with an appropriate amount of liquid carrier prior to use. In such an embodiment, the polishing composition concentrate can comprise a liquid carrier, and optionally other components in amounts such that, upon dilution of the concentrate with an appropriate amount of liquid carrier, each component will be present in the polishing composition in an amount within the appropriate range recited above for each component. For example, each component can be present in the concentrate in an amount that is about 2 times (e.g., about 3 times, about 4 times, or about 5 times) greater than the concentration recited above for each component in the polishing composition so that, when the concentrate is diluted with an appropriate volume of liquid carrier (e.g., an equal volume of liquid carrier, 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the polyether amine and other suitable additives, such as an abrasive, are at least partially or fully dissolved or suspended in the concentrate.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention (which generally is disposed between the substrate and the polishing pad), with the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Desirably, the inspection or monitoring of the progress of the polishing process with respect to a substrate being polished enables the determination of the polishing end-point, i.e., the determination of when to terminate the polishing process with respect to a particular substrate. Such methods are described, for example, in U.S. Pat. Nos. 5,196,353, 5,433, 651, 5,609,511, 5,643,046, 5,658,183, 5,730,642, 5,838,447, 5,872,633, 5,893,796, 5,949,927, and 5,964,643.

Polishing refers to the removal of at least a portion of a surface to polish the surface. Polishing can be performed to provide a surface having reduced surface roughness by removing gouges, crates, pits, and the like, but polishing also can be performed to introduce or restore a surface geometry characterized by an intersection of planar segments.

The substrate to be polished using the method of the invention can be any suitable substrate. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads. The substrate can further comprise at least one other layer, e.g., an insulating layer. The insulating layer can be a metal oxide, porous metal oxide, glass, organic polymer, fluorinated organic polymer, or any other suitable high or low-κ insulating layer. The insulating layer can comprise, consist of, or consist essentially of silicon oxide, silicon nitride, or combinations thereof. The silicon oxide can be any suitable silicon oxide, many of which are known in the art. Suitable types of silicon oxide include but are not limited to borophosphosilicate glass (BPSG), plasma-enhanced tetraethyl ortho silicate (PETEOS), thermal oxide, undoped silicate glass, and high density plasma (HDP) oxide. The substrate can further comprise at least one additional insulating layer. The at least one additional insulating layer can comprise, consist of, or consist essentially of silicon oxide, silicon nitride, or combinations thereof. The substrate can further comprise a metal layer. The metal layer can comprise, consist essentially of, or consist of any suitable metal, many of which are known in the art, such as, for example, tungsten.

The method of the invention is particularly useful in polishing a substrate comprising at least one layer of silicon nitride. The silicon nitride layer can be removed at a rate of about 50 Å/min or more (e.g., about 100 Å/min or more, about 200 Å/min or more, about 300 Å/min or more, about 400 Å/min or more, or about 500 Å/min or more). The silicon nitride layer can be removed at a rate of about 5000 Å/min or less (e.g., about 3000 Å/min or less, about 2000 Å/min or less, about 1000 Å/min or less, about 800 Å/min or less, or about 500 Å/min or less). Accordingly, the silicon nitride layer can be removed from the substrate at a rate of about 50 Å/min to about 5000 Å/min (e.g., about 100 Å/min to about 2000 Å/min, about 200 Å/min to about 1500 Å/min, about 300 Å/min to about 1500 Å/min, about 400 Å/min to about 1200 Å/min, about 500 Å/min to about 1200 Å/min, or about 500 Å/min to about 5000 Å/min).

The method of the invention is also particularly useful in polishing a substrate comprising at least one layer of silicon oxide. The silicon oxide layer can be removed at a rate of about 1 Å/min or more (e.g., about 50 Å/min or more, about 80 Å/min or more, about 100 Å/min or more, about 200 Å/min or more, or about 300 Å/min or more). The silicon oxide layer can be removed at a rate of about 5000 Å/min or less (e.g., about 3000 Å/min or less, about 1000 Å/min or less, about 500 Å/min or less, about 300 Å/min or less, about 200 Å/min or less, about 100 Å/min or less, or about 50 Å/min or less). Accordingly, the silicon oxide layer can be removed from the substrate at a rate of about 1 Å/min to about 500 Å/min (e.g., about 1 Å/min to about 400 Å/min, about 1 Å/min to about 300 Å/min, about 1 Å/min to about 250 Å/min, about 1 Å/min to about 200 Å/min, or about 1 Å/min to about 150 Å/min).

The substrate can comprise at least one layer of silicon nitride and at least one layer of silicon oxide, wherein the silicon nitride layer is selectively removed relative to the layer of silicon oxide. For example, the silicon nitride can be removed from the substrate at a rate greater than that of the silicon oxide.

The following examples further illustrate the invention but, of course, should not be construed as in any way limiting its scope.

EXAMPLE 1

This example demonstrates the effect on the removal rate of silicon oxide and silicon nitride by the polymer concentration of a polishing composition containing colloidal silica particles which have been treated with at least one aminosilane compound.

A TEOS wafer and a silicon nitride wafer were polished with six different polishing compositions. Each polishing composition contained 1 wt. % colloidal silica that was treated with 300 ppm bis(trimethoxysilylpropyl)amine (SILQUEST A1170) (compositions 1A-1D), 300 ppm gamma-aminopropyl triethoxysilane (SILQUEST A 1100) (composition 1E), or 210 ppm gamma-aminopropyl triethoxysilane and 80 ppm bis(trimethoxysilylpropyl)amine (composition 1F). Each of the polishing compositions also contained 1000 ppm 1-hydroxyethylidene-1,1-diphosphonic acid (DEQUEST 2010) and had a pH of 2.3. The concentration of polymer (homopolymer of methacryloyloxyethyltrimethylammonium chloride (Alco 4773)) in each polishing composition is indicated in Table 1. The substrates were polished for 1 minute using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and the silicon nitride removal rate (Å/min) were determined for each polishing composition, and the results are shown in Table 1.

TABLE 1

| Polishing Composition | Polymer Conc. (ppm) | Silicon Oxide Removal Rate (Å/min) | Silicon Nitride Removal Rate (Å/min) |
| --- | --- | --- | --- |
| 1A | 10 | 589 | 945 |
| 1B | 20 | 13 | 883 |
| 1C | 30 | 0 | 787 |
| 1D | 0 | 920 | 899 |
| 1E | 40 | 0 | 863 |
| 1F | 40 | 4 | 651 |

As is apparent from the data presented in Table 1, the silicon oxide removal rate substantially decreased as the amount of polymer increased, whereas the silicon nitride removal rate moderately increased as the amount of polymer increased. Thus, the polymer concentration can be adjusted to alter the polishing rate of both silicon oxide and silicon nitride.

EXAMPLE 2

This example demonstrates the effect on the removal rate of silicon oxide and silicon nitride by the molecular weight of a polymer in a polishing composition containing colloidal silica particles which have been treated with an aminosilane compound.

A TEOS wafer and a silicon nitride wafer were polished with nine different polishing compositions. Polishing compositions 2A-2D and 2F-2I contained a homopolymer of methacryloyloxyethyltrimethylammonium chloride (Alco 4773), and polishing composition 2E contained a homopolymer of methacryloyloxyethyltrimethylammonium chloride (Nalco). The molecular weights and concentrations of polymer contained in each of the compositions is indicated in Table 2. Each of the polishing compositions also contained 1 wt. % colloidal silica that was treated with 320 ppm gamma-aminopropyl triethoxysilane (SILQUEST A1100), and contained 1500 ppm 1-hydroxyethylidene-1,1-diphosphonic acid (DEQUEST 2010). Each polishing composition had a pH of 2.2. The substrates were polished for 1 minute (TEOS) or 30 seconds (nitride) using a Logitech II polisher set with a 48-55 kPa (7-8 psi) down force, a platen speed of 90 rpm, a carrier speed of 84 rpm, and a composition flow rate of 80 ml/min.

The silicon oxide removal rate (Å/min) and the silicon nitride removal rate (Å/min) were determined for each polishing composition, and the results are shown in Table 2.

TABLE 2

| Polishing Composition | Polymer Conc. (ppm) | Polymer Molecular Weight (kDa) | Silicon Oxide Removal Rate (Å/min) | Silicon Nitride Removal Rate (Å/min) |
| --- | --- | --- | --- | --- |
| 2A | 50 | 66 | 888 | 1266 |
| 2B | 50 | 12 | 4 | 1294 |
| 2C | 50 | 26 | 708 | 1360 |
| 2D | 50 | 15 | 1 | 1332 |
| 2E | 50 | 5 | 5 | 778 |
| 2F | 70 | 66 | 718 | 1174 |
| 2G | 70 | 12 | 3 | 1168 |
| 2H | 70 | 26 | 257 | 1226 |
| 2I | 50 | 15 | 4 | 1074 |

As is apparent from the data presented in Table 2, the silicon oxide removal rate decreased as the molecular weight of the polymer decreased, whereas the silicon nitride removal rate was relatively stable.

EXAMPLE 3

This example demonstrates the effect on the removal rate of silicon oxide and silicon nitride by the polymer concentration of a polishing composition containing various concentrations of colloidal silica particles which have been treated with different concentrations of an aminosilane compound.

A TEOS wafer and a silicon nitride wafer were polished with twelve different polishing compositions. Each of the polishing compositions contained colloidal silica that was treated with gamma-aminopropyl triethoxysilane (SILQUEST A1100) and a homopolymer of methacryloyloxyethyltrimethylammonium chloride (Alco 4773), the concentrations of which are indicated in Table 3. Each of the polishing compositions also contained 1500 ppm 1-hydroxyethylidene-1,1-diphosphonic acid (DEQUEST 2010) and had a pH of 2.2. The substrates were polished for 1 minute using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and the silicon nitride removal rate (Å/min) were determined for each polishing composition, and the results are shown in Table 3.

TABLE 3

| Polishing Composition | Silica (wt. %) | SILQUEST A1100 Conc. (ppm) | Polymer Conc. (ppm) | Silicon Oxide Removal Rate (Å/min) | Silicon Nitride Removal Rate (Å/min) |
|---|---|---|---|---|---|
| 3A | 0.5 | 130 | 20 | 552 | 692 |
| 3B | 0.5 | 130 | 35 | 366 | 660 |
| 3C | 0.5 | 130 | 50 | 9 | 561 |
| 3D | 1 | 280 | 30 | 681 | 687 |
| 3E | 1 | 280 | 60 | 17 | 639 |
| 3F | 1 | 280 | 90 | 11 | 570 |
| 3G | 0.5 | 150 | 20 | 450 | 564 |
| 3H | 0.5 | 150 | 35 | 235 | 573 |
| 3I | 0.5 | 150 | 50 | 9 | 577 |
| 3J | 1 | 320 | 30 | 524 | 577 |
| 3K | 1 | 320 | 60 | 7 | 588 |
| 3L | 1 | 320 | 90 | 5 | 473 |

As is apparent from the data presented in Table 3, the silicon oxide removal rate decreased as the amount of polymer increased, especially at higher concentrations of aminosilane. The silicon nitride removal rates remained relatively stable with changes in the amount of polymer and aminosilane.

EXAMPLE 4

This example demonstrates the effect on the removal rate of silicon oxide and silicon nitride by the polymer concentration and pH of a polishing composition containing colloidal silica particles which have been treated with an aminosilane compound.

A TEOS wafer and a silicon nitride wafer were polished with eight different polishing compositions. Each of the polishing compositions contained 1000 ppm 1-hydroxyethylidene-1,1-diphosphonic acid (DEQUEST 2010) and 1 wt. % colloidal silica that was treated with 300 ppm gamma-aminopropyl triethoxysilane (SILQUEST A1100). The pH of each polishing composition, polymer concentration (homopolymer of methacryloyloxyethyltrimethylammonium chloride (Alco 4773)), and type of additional acid used to adjust the pH of each composition are indicated in Table 4. The substrates were polished for 1 minute using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and the silicon nitride removal rate (Å/min) were determined for each polishing composition, and the results are shown in Table 4.

TABLE 4

| Polishing Composition | pH | Polymer Conc. (ppm) | Additional Acid | Silicon Oxide Removal Rate (Å/min) | Silicon Nitride Removal Rate (Å/min) |
|---|---|---|---|---|---|
| 4A | 2.4 | 50 | — | 2 | 730 |
| 4B | 2.4 | 50 | HNO$_3$ | 2 | 716 |
| 4C | 2.35 | 50 | HNO$_3$ | 10 | 657 |
| 4D | 2.3 | 50 | HNO$_3$ | 0 | 512 |
| 4E | 2.3 | 30 | HNO$_3$ | 14 | 651 |
| 4F | 2.3 | 10 | HNO$_3$ | 755 | 801 |
| 4G | 2.4 | 50 | NH$_4$NO$_3$ | 12 | 672 |
| 4H | 2.4 | 50 | Acetic acid | 8 | 702 |

As is apparent from the data presented in Table 4, the silicon oxide removal rate decreased as the amount of polymer increased, whereas the silicon nitride removal rate remained relatively stable. Increasing the pH slightly increased the silicon nitride removal rate.

EXAMPLE 5

This example demonstrates the effect on the removal rate of silicon oxide and silicon nitride by the polymer concentration of a polishing composition containing various concentrations of colloidal silica particles which have been treated with different concentrations of an aminosilane compound.

A TEOS wafer and a silicon nitride wafer were polished with fifteen different polishing compositions. Each of the polishing compositions contained 1500 ppm 1-hydroxyethylidene-1,1-diphosphonic acid (DEQUEST 2010) and colloidal silica that was treated with gamma-aminopropyl triethoxysilane (SILQUEST A1100), the concentrations of which are indicated in Table 5. In addition, compositions 5A-5L contained a homopolymer of methacryloyloxyethyltrimethylammonium chloride (Alco 4773), and compositions 5M-5O contained diallyldimethylammonium chloride (Nalco TX13645), in the concentrations indicated in Table 5. The substrates were polished for 1.5 minutes using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and silicon nitride removal rate (Å/min) were determined for each polishing composition, and the results are shown in Table 5.

TABLE 5

| Polishing Composition | Silica (wt. %) | SILQUEST A1100 Conc. (ppm) | Polymer Conc. (ppm) | Silicon Oxide Removal Rate (Å/min) | Silicon Nitride Removal Rate (Å/min) |
|---|---|---|---|---|---|
| 5A | 0.2 | 50 | 10 | 62 | 582 |
| 5B | 0.2 | 50 | 20 | 16 | 536 |
| 5C | 0.2 | 50 | 30 | 7 | 493 |
| 5D | 0.2 | 20 | 15 | 227 | 468 |
| 5E | 0.2 | 50 | 15 | 202 | 522 |
| 5F | 0.2 | 80 | 15 | 308 | 619 |
| 5G | 0.2 | 20 | 30 | 147 | 430 |
| 5H | 0.2 | 50 | 30 | 12 | 466 |
| 5I | 0.2 | 80 | 30 | 39 | 529 |
| 5J | 0.5 | 20 | 30 | 353 | 675 |
| 5K | 0.5 | 50 | 30 | 530 | 704 |
| 5L | 0.5 | 80 | 30 | 378 | 723 |
| 5M | 0.5 | 20 | 50 | 378 | 586 |
| 5N | 0.5 | 50 | 50 | 13 | 587 |
| 5O | 0.5 | 80 | 50 | 15 | 631 |

As is apparent from the data presented in Table 5, the polymer type, polymer concentration, silica concentration, and aminosilane concentration can be adjusted to alter the polishing rate of both silicon oxide and silicon nitride.

EXAMPLE 6

This example demonstrates the effect on the removal rate of silicon oxide and silicon nitride by the polymer concentration of a polishing composition containing silica particles which have been treated with an aminosilane compound.

A TEOS wafer and a silicon nitride wafer were polished with eight different polishing compositions. Each of the polishing compositions contained colloidal silica that was treated with gamma-aminopropyl triethoxysilane (SILQUEST A1100), and a homopolymer of methacryloyloxyethyltrimethylammonium chloride (Alco 4773), the concentrations of which are indicated in Table 6. Additionally, compositions 6A-6D contained 1500 ppm 1-hydroxyethylidene-1,1-diphosphonic acid (DEQUEST 2010), and compositions 6E-6H contained amino tri(methylene phosphonic acid) (DEQUEST 2000). The substrates were polished for 1 minute using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and silicon nitride removal rate (Å/min) were determined for each polishing composition, and the results are shown in Table 6.

TABLE 6

| Polishing Composition | Polymer Conc. (ppm) | SILQUEST A1100 Conc. (ppm) | Silica (wt. %) | Silicon Oxide Removal Rate (Å/min) | Silicon Nitride Removal Rate (Å/min) |
|---|---|---|---|---|---|
| 6A | 40 | 150 | 0.5 | 144 | 542 |
| 6B | 60 | 150 | 0.5 | 8 | 474 |
| 6C | 50 | 320 | 1 | 25 | 734 |
| 6D | 70 | 320 | 1 | 17 | 656 |
| 6E | 55 | 280 | 1 | 16 | 892 |
| 6F | 58 | 280 | 1 | 0 | 557 |
| 6G | 55 | 360 | 1 | 8 | 715 |
| 6H | 85 | 360 | 1 | 4 | 457 |

As is apparent from the data presented in Table 6, the concentration of polymer, silica, and aminosilane can be adjusted to alter the polishing rate of both silicon oxide and silicon nitride.

EXAMPLE 7

This example demonstrates the effect on the removal rate of silicon oxide and silicon nitride by a polishing composition containing silica particles which have been treated with an aminosilane compound.

A TEOS wafer and a silicon nitride wafer were polished with ten different polishing compositions. Each of the polishing compositions contained 1 wt. % colloidal silica that was treated with either bis(trimethoxysilylpropyl)amine (SILQUEST A1170) (compositions 7A-7H) or gamma-aminopropyl triethoxysilane (SILQUEST A1100) (compositions 7I and 7J) in the amounts indicated in Table 7. Each composition also contained 1000 ppm 1-hydroxyethylidene-1,1-diphosphonic acid (DEQUEST 2010) and had a pH of 2.3. In addition, all compositions except for composition 7I contained 40 ppm of a homopolymer of methacryloyloxyethyltrimethylammonium chloride (Alco 4773). The substrates were polished for 1 minute using a Logitech II polisher set with a 28 kPa (4 psi) down force, a platen speed of 90 rpm, a carrier speed of 84 rpm, and a composition flow rate of 80 ml/min.

The silicon oxide removal rate (Å/min) and silicon nitride removal rate (Å/min) were determined for each polishing composition, and the results are shown in Table 7.

TABLE 7

| Polishing Composition | Silane Conc. (ppm) | Silicon Oxide Removal Rate (Å/min) | Silicon Nitride Removal Rate (Å/min) | Silicon Oxitde/Silicon Nitride Selectivity |
|---|---|---|---|---|
| 7A | 50 | 431 | 626 | 0.69 |
| 7B | 75 | 207 | 734 | 0.28 |
| 7C | 100 | 0 | 766 | 0.00 |
| 7D | 150 | 2 | 714 | 0.00 |
| 7E | 250 | 9 | 641 | 0.01 |
| 7F | 350 | 10 | 581 | 0.17 |
| 7G | 350 | 7 | 401 | 0.17 |
| 7H | 450 | 0 | 5 | 0.00 |
| 7I | 300 | 1 | 594 | 0.00 |
| 7J | 300 | 856 | 938 | 0.91 |

As is apparent from the data presented in Table 7, increasing the concentration of silane treating agent improved the selectivity of silicon nitride to silicon oxide.

EXAMPLE 8

This example demonstrates the stability over time of a polishing composition containing a polymer and silica particles which have been treated with an aminosilane compound.

Each of the polishing compositions contained 1 wt. % colloidal silica that was treated with either bis(trimethoxysilylpropyl)amine (SILQUEST A1170) (compositions 8A-8F) or gamma-aminopropyl triethoxysilane (SILQUEST A1100) (compositions 8G and 8H) in the amounts indicated in Table 8. Each composition also contained 1000 ppm 1-hydroxyethylidene-1,1-diphosphonic acid (DEQUEST 2010) and had a pH of 2.3. In addition, all compositions except for composition 8H contained 40 ppm of a homopolymer of methacryloyloxyethyltrimethylammonium chloride (Alco 4773).

The polishing compositions were aged for two weeks at 45° C. Average particle size, zeta potential, free polymer in solution, and free silane in solution were then measured, and the results are shown in Table 8.

TABLE 8

| Polishing Composition | Silane Conc. (ppm) | Average Particle Size (nm) | Zeta Potential (mV) | Free Polymer Conc. (ppm) | Free Silane Conc. (ppm) |
|---|---|---|---|---|---|
| 8A | 150 | 380 | 35 | 9 | undetectable |
| 8B | 250 | 314 | 35 | 8 | undetectable |
| 8C | 350 | 71 | 34 | 34 | 26 |
| 8D | 350 | — | — | 53 | undetectable |
| 8E | 350 | 56 | 42 | 44 | 11 |
| 8F | 450 | 123 | 37 | 67 | 82 |
| 8G | 300 | 217 | 39.4 | 6 | 199 |
| 8H | 300 | 51 | 42 | 0 | 150 |

As is apparent from the data presented in Table 8, the use of a dipodal silane (SILQUEST A1170) resulted in more polymer remaining free in solution and allowed more aminosilane to remain associated with the colloidal silica particles over time when compared with a silane containing only one silyl group per molecule (SILQUEST A1100).

EXAMPLE 9

This example demonstrates the effect on the removal rate of silicon oxide and silicon nitride by a polishing composition containing an untreated silica particle and a cationic polymer.

A TEOS wafer and a silicon nitride wafer were polished with five different polishing compositions. Each of the polishing compositions contained 1 wt. % colloidal silica, 1000 ppm 1-hydroxyethylidene-1,1-diphosphonic acid (DEQUEST 2010), and had a pH of 2.3. In addition, all compositions except for composition 9A contained a co-polymer of methacryloxyloxyethyltrimethylammonium chloride and acrylamide, poly(methacryloyloxyethyltrimethylammonium chloride-co-acrylamide), (25%/75%) in the amount indicated in Table 9. The substrates were polished for either 1 minute (TEOS) or 30 sec. (nitride) using a Mirra polisher set with a 28 kPa (4 psi) down force, a platen speed of 93 rpm, a carrier speed of 84 rpm, and a composition flow rate of 150 ml/min.

The silicon oxide removal rate (Å/min) and silicon nitride removal rate (Å/min) were determined for each polishing composition, and the results are shown in Table 9.

TABLE 9

| Polishing Composition | Polymer Conc. (ppm) | Silicon Oxide Removal Rate (Å/min) | Silicon Nitride Removal Rate (Å/min) | Silicon Nitride/Silicon Oxide Selectivity |
|---|---|---|---|---|
| 9A | 0 | 121 | 428 | 3.53 |
| 9B | 25 | 26 | 552 | 21.2 |
| 9C | 50 | 20 | 600 | 30.0 |
| 9D | 75 | 15 | 592 | 39.5 |
| 9E | 100 | 12 | 439 | 36.6 |

As is apparent from the data presented in Table 9, the use of a cationic polymer is effective in increasing the selectivity between silicon nitride and silicon dioxide in a slurry containing colloidal silica and an acid.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition for polishing a substrate comprising:
    (a) a liquid carrier,
    (b) an abrasive suspended in the liquid carrier, wherein the abrasive comprises colloidal silica particles, and wherein the colloidal silica particles have a surface which has been treated with an aminosilane compound,
    (c) at least one acidic component having a pKa of about 1 to about 4, wherein the at least one acidic component is present in an amount of about 500 ppm to about 3000 ppm, and
    (d) a cationic polymer, wherein the cationic polymer is present in an amount of about 10 ppm to about 100 ppm; wherein the polishing composition has a pH of about 1 to about 3.5.

2. The polishing composition of claim 1, wherein the colloidal silica particles are present in the polishing composition in an amount of about 0.1 wt % to about 4 wt %.

3. The polishing composition of claim 1, wherein the aminosilane compound is selected from the group consisting of a dipodal silane, aminopropyl trialkoxysilane, and bis(trimethoxysilylpropyl)amine.

4. The polishing composition of claim 1, wherein the colloidal silica particles having a surface which has been treated with the aminosilane compound have a zeta potential of 5 mV or greater.

5. The polishing composition of claim 1, wherein the aminosilane compound is present in an amount of about 50 ppm to about 500 ppm.

6. The polishing composition of claim 1, wherein the at least one acidic component is selected from the group consisting of an inorganic acid, a carboxylic acid, an organic phosphonic acid, an acidic heterocyclic compound, 1-hydroxyethylidene-1,1-diphosphonic acid, amino tri(methylene phosphonic acid), a salt thereof, and combinations thereof.

7. The polishing composition of claim 1, wherein the polishing composition has a pH of about 1.5 to about 3.5.

8. The polishing composition of claim 1, wherein the cationic polymer is either a monomer of methacryloyloxyethyltrimethylammonium or diallyldimethylammonium.

9. A method of chemically-mechanically polishing a substrate, which method comprises:
    (i) contacting a substrate with a chemical-mechanical polishing composition comprising:
        (a) a liquid carrier,
        (b) an abrasive suspended in the liquid carrier, wherein the abrasive comprises colloidal silica, and wherein the colloidal silica particles have a surface which has been treated with an aminosilane compound, (c) at least one acidic component having a pKa of about 1 to about 4, wherein the at least one acidic component is present in an amount of about 500 ppm to about 3000 ppm, and (d) a cationic polymer, wherein the cationic polymer is present in an amount of about 10 ppm to about 100 ppm, wherein the polishing composition has pH of about 1 to about 3.5, (ii) moving the polishing composition relative to the substrate, and (iii) abrading at least a portion of the substrate to polish the substrate.

10. The method of claim 9, wherein the colloidal silica particles are present in the polishing composition in an amount of about 0.1 wt % to about 4.0 wt %.

11. The method of claim 9, wherein the colloidal silica particles having a surface which has been treated with the aminosilane compound have a zeta potential of 5 mV or greater.

12. The method of claim 9, wherein the aminosilane compound is selected from the group consisting of a dipodal silane, aminopropyl trialkoxysilane, and bis(trimethoxysilylpropyl)amine.

13. The method of claim 9, wherein the aminosilane compound is present in an amount of about 100 ppm to about 500 ppm.

14. The method of claim 9, wherein the at least one acidic component is selected from the group consisting of an inorganic acid, a carboxylic acid, an organic phosphonic acid, an acidic heterocyclic compound, 1-hydroxyethylidene-1,1-diphosphonic acid, amino tri(methylene phosphonic acid), a salt thereof, and combinations thereof.

15. The method of claim 9, wherein the polishing composition has a pH of about 1.5 to about 3.5.

16. The method of claim 9, wherein the cationic polymer is either a monomer of methacryloyloxyethyltrimethylammonium or diallyldimethylammonium.

17. The method of claim 9, wherein the substrate comprises at least one layer of silicon nitride.

18. The method of claim 17, wherein the substrate comprises at least one layer of silicon oxide.

19. The method of claim 18, wherein the silicon nitride is removed from the substrate at a rate greater than that of the silicon oxide.

* * * * *